(12) United States Patent
Brase et al.

(10) Patent No.: US 7,655,563 B2
(45) Date of Patent: Feb. 2, 2010

(54) METHOD FOR PREVENTING THE FORMATION OF DENTRITES IN A SEMICONDUCTOR

(75) Inventors: Gabriela Brase, Unterhaching (DE); Martin Ostermayr, Feldkirchen (DE); Erwin Ruderer, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 11/963,373

(22) Filed: Dec. 21, 2007

(65) Prior Publication Data

US 2008/0124905 A1 May 29, 2008

Related U.S. Application Data

(63) Continuation of application No. 11/150,659, filed on Jun. 10, 2005, now abandoned, which is a continuation of application No. PCT/DE03/03934, filed on Nov. 27, 2003.

(51) Int. Cl.
*H01L 21/4763* (2006.01)
(52) U.S. Cl. ............... 438/645; 438/631; 438/637; 438/621; 257/E21.585
(58) Field of Classification Search ............ 438/618, 438/621, 626, 185, 231, 232, 247, 252, 495, 438/631, 645, 637, 672, 675; 257/21.042, 257/21.243, 21.58, 21.583, 21.585
See application file for complete search history.

(56) References Cited

U.S. PATENT DOCUMENTS

| 5,804,864 | A | 9/1998 | Akiyama |
| 6,150,269 | A | 11/2000 | Roy |
| 6,310,365 | B1 | 10/2001 | Chen |
| 6,720,622 | B1 * | 4/2004 | Yu .......................... 257/355 |
| 2002/0142576 | A1 | 10/2002 | Noguchi et al. |

FOREIGN PATENT DOCUMENTS

| EP | 0 759 638 | 2/1997 |
| EP | 1 162 664 | 12/2001 |

OTHER PUBLICATIONS

A Review of RESURF Technology, ISPSO, May 2000, pp. 11-18.
International Search Report for PCT/DE03/03934.

* cited by examiner

*Primary Examiner*—Davienne Monbleau
*Assistant Examiner*—Dilinh P Nguyen
(74) *Attorney, Agent, or Firm*—Brinks Hofer Gilson & Lione

(57) ABSTRACT

The invention relates to a semiconductor circuit arrangement having a semiconductor substrate, a first doping region, a second doping region, a connection doping region, an insulation layer and an electrically conductive structure which is to be planarized, it being possible for the charge carriers formed during a planarization step to be reliably dissipated, and for dendrite formation to be prevented, by a discharge doping region formed in the first and second doping regions.

11 Claims, 3 Drawing Sheets

METHOD FOR PREVENTING THE FORMATION OF DENTRITES IN A SEMICONDUCTOR

RELATED APPLICATIONS

The present patent document is a continuation of U.S. patent application Ser. No. 11/150,659, filed Jun. 10, 2005 now abandoned, which is a continuation of PCT Application Serial No. PCT/DE03103934, filed Nov. 27, 2003, designating the United States and published in German, which claims priority to German Application Serial No. 102 57 682.3, filed Dec. 10, 2002, the entirety of each of which is hereby incorporated by reference.

FIELD OF THE INVENTION

The present invention relates to a semiconductor circuit arrangement and in particular to a semiconductor circuit arrangement for preventing the formation of dendrites during a planarization step.

BACKGROUND

Ever higher integration densities are being sought after in integrated semiconductor circuits, leading to reduced feature sizes in the semiconductor material and in particular to reduced feature widths of the electrically conductive structures. Where these electrically conductive structures have hitherto preferably been deposited by means of aluminum layers in corresponding wiring levels to produce interconnects and then patterned by photolithography, conventional methods of this nature can no longer be used for current and future interconnect structures on account of the limited scalability and insufficient migration properties.

Therefore, alternative materials and methods are increasingly being employed, in particular for use in metallization layers of this nature, in order to satisfy the increasing integration density. The use of, for example, copper for wiring levels of this type makes it possible, on account of the significantly improved scalability compared to aluminum, to develop integrated semiconductor circuits which work with a significantly higher current-carrying capacity and at a lower power consumption.

Consequently, what are known as Damascene or dual-Damascene processes, in which a trench in an insulating or dielectric layer is substantially filled with electrically conductive material and is then planarized, resulting in a highly planar electrically conductive structure, are increasingly being used to realize electrically conductive structures with a very small feature size of this nature.

Particularly in the case of a planarization step of this nature, there is a risk of residues in the form of dendrites being formed at metal interconnects, which can lead to functional failures.

FIGS. 1A and 1B show a simplified plan view and a simplified sectional view of a semiconductor circuit arrangement in accordance with the prior art in order to illustrate dendrite formation of this nature during the abovementioned planarization step.

In accordance with FIGS. 1A and 1B, a semiconductor circuit arrangement comprises, for example, a semiconductor substrate 1, which has a first doping region of a first conduction type p. In this first doping region 1, by way of example, a second doping region 2 in the form of an n– doped well is formed, a connection doping region 3 having, for example, an $n^+$ doping being formed at the semiconductor surface for connection of the second doping region 2.

In accordance with FIGS. 1A and 1B, the electrically conductive structure has, for example, an interconnect layer 5 formed in a trench and a contact hole or via 4 filled with electrically conductive material.

During the above-described fabrication of the interconnect layer 5 in the trench, a planarization step is fundamentally required to realize the very fine feature sizes, which usually involves carrying out a chemical mechanical polishing (CMP) step. However, this planarization step may result in an undesired charging of the second doping region or of the well 2, which leads to an excessive field strength at this location, in particular on account of the very small surface areas in the interconnect layer 5. These electrical field peaks produced by the charging effect described above cause a mixture of abrasive material and abraded metal, which is usually electrically conductive, formed during the planarization step to accumulate at these electrostatically charged interconnect layers 5 and/or to induce the formation of what are known as dendrites.

This growth and/or this accumulation of grinding residues S (slurry) can only be removed with difficulty, in particular with tightly packed semiconductor circuits and very small surface areas of the planarized interconnect layer 5, and consequently undesirable short circuits can occur with adjacent interconnect structures, or in the encapsulated state corrosion and degradation may propagate from this corrosive soiling.

FIGS. 2A and 2B show a simplified plan view and a simplified sectional view of a semiconductor circuit arrangement in accordance with the prior art in which this problem of the formation of dendrites and/or the accumulation of abrasive material S is eliminated.

In accordance with FIGS. 2A and 2B, this problem of dendrite formation in an integrated semiconductor circuit is usually eliminated by corresponding planarized interconnect layers or interconnect layers which are to be planarized being blunted by increasing their surface area and thereby reducing the electrical field strength in this region. More specifically, in accordance with FIGS. 2A and 2B, in the event of dendrite formation of this nature being detected, layout changes are usually made to the interconnect or metallization plane such that these very small interconnect surface areas 5 are correspondingly increased in size, with the result that the electrical field peaks in this region are sufficiently reduced and the above-described dendrite formation and/or the accumulation of grinding residues can be reliably prevented.

However, a drawback in this case is that the advantage of a higher integration density which is actually sought after is in this way at least partially negated again, since to avoid the formation of dendrites a metallization or interconnect surface area which is up to six times larger is required for each metallization or interconnect plane.

This in turn has adverse effects on the circuit design and on corrections to existing layouts, and consequently existing layouts cannot readily be converted to the next shrink down or the next integration density down.

SUMMARY

The invention is therefore based on the object of providing a semiconductor circuit arrangement which reliably prevents dendrite formation of this nature even with very small feature sizes.

In particular the formation of a discharge doping region of the second conduction type at least in the first and second doping regions allows the charges which are formed in particular during a planarization operation to be reliably dissipated into a semiconductor substrate, so that the formation of electrical field peaks at an electrically conductive structure to be planarized and thereby a formation of dendrites can be reliably prevented.

It is preferable for this discharge doping region to be formed as a diffusion strip directly at the surface of the semiconductor substrate in a junction region between the first and second doping regions. This results both in electrical contact being made with the second doping region and in a diode junction to the first doping region with minimal additional outlay, with the result that charging phenomena can be compensated for particularly effectively and easily.

The discharge doping region may preferably also be formed as part of the connection doping region, resulting in further simplification and meaning that the connection doping region only has to be shifted into a junction region of the first and second doping regions in order to realize the additional function of the desired dissipation of charge carriers into the semiconductor substrate.

Furthermore, the discharge doping region may also have a first discharge doping subregion in the first doping region and a second discharge doping subregion in the second doping region, with the discharge doping subregions being connected to one another via an electrically conductive structure. In this case too, the desired removal of charge carriers from the second doping region is achieved, so that the formation of dendrites at an electrically conductive structure which is to be planarized can be reliably avoided.

The invention is described in more detail below on the basis of exemplary embodiments and with reference to the drawing.

DETAILED DESCRIPTION OF THE DRAWINGS AND THE PRESENTLY PREFERRED EMBODIMENTS

Figure 3A:
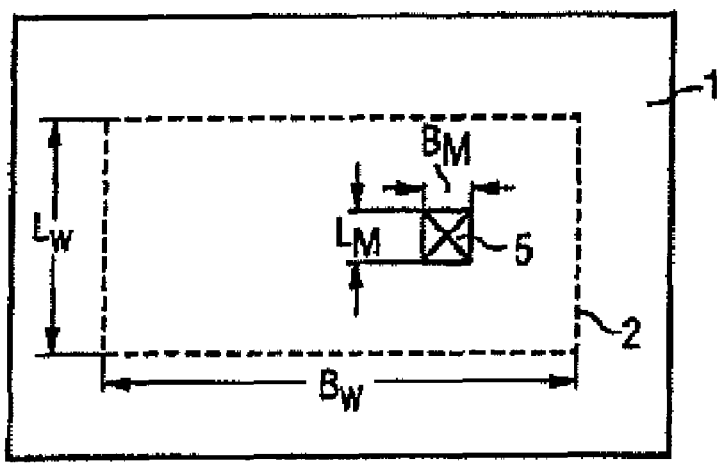
FIGS. 3A and 3B show a simplified plan view and sectional view of a semiconductor circuit arrangement in accordance with a first exemplary embodiment.
Figure 3B:
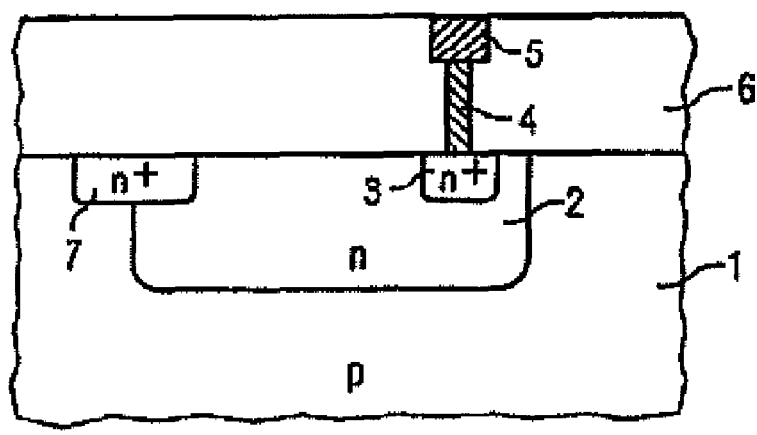

FIGS. 3A and 3B show a simplified plan view and a simplified sectional view of a semiconductor circuit arrangement in accordance with a first exemplary embodiment; identical reference symbols denote identical or corresponding elements and/or layers to those shown in FIGS. 1A to 2B, and these elements and layers will not be described again.

In accordance with FIGS. 3A and 3B, a semiconductor substrate 1 having at least one first doping region of a first conduction type p also includes a second doping region 2 of a second conduction type n, which is opposite to the first conduction type p. Furthermore, a highly doped connection doping region 3 of the second conduction type n is in turn located in the second doping region 2 in order to connect this region, resulting in an ohmic junction with the second doping region 2. One or a multiplicity of insulation layers 6, in which the electrically conductive structure to be planarized is at least partially embedded and makes electrical contact with the connection doping region 3, is formed on the surface of the semiconductor substrate 1. The electrically conductive structure in this case comprises a contact hole or via 4 filled with electrically conductive material, and an interconnect layer 5 which is electrically connected thereto.

To realize the interconnect layer 5, it is preferable to carry out what is known as a Damascene or dual-Damascene process, in which a trench for the interconnect layer 5 is formed in the dielectric layer or insulation layer 6. In subsequent steps, by way of example, a diffusion barrier layer (not shown) and a seed layer (not shown), allowing or simplifying subsequent growth of, for example, a Cu layer 5, are formed both on the surface and in the trench of the insulation layer 6. Finally, a planarization step is carried out, for example by means of a CMP (Chemical Mechanical Polishing) process, this planarization process being used to remove a layer sequence which remains above the trench and being considered the actual cause of the charging and/or dendrite formation described above.

Figure 1A:
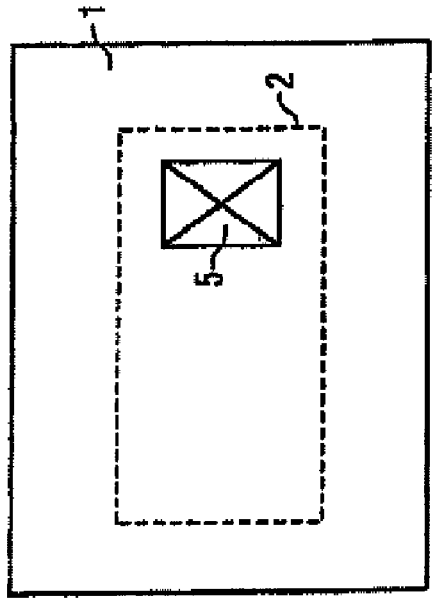
FIGS. 1A and 1B show a simplified plan view and sectional view of a semiconductor circuit arrangement in accordance with the prior art.
Figure 2A:
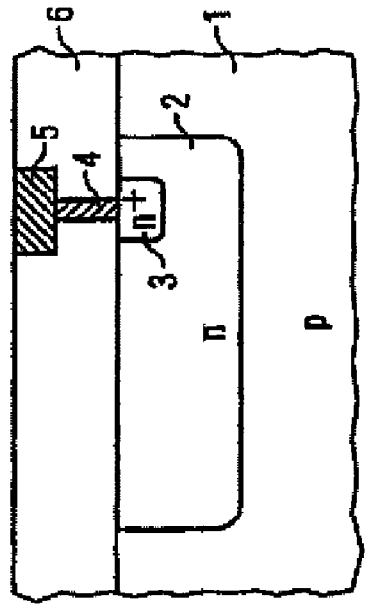
FIGS. 2A and 2B show a simplified plan view and sectional view of a further semiconductor circuit arrangement in accordance with the prior art.
Figure 1B:
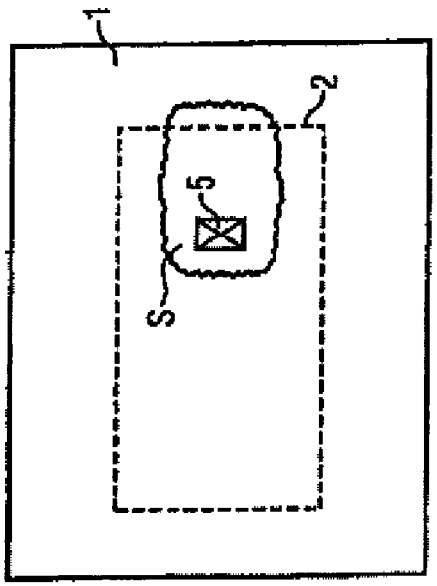
Figure 2B:
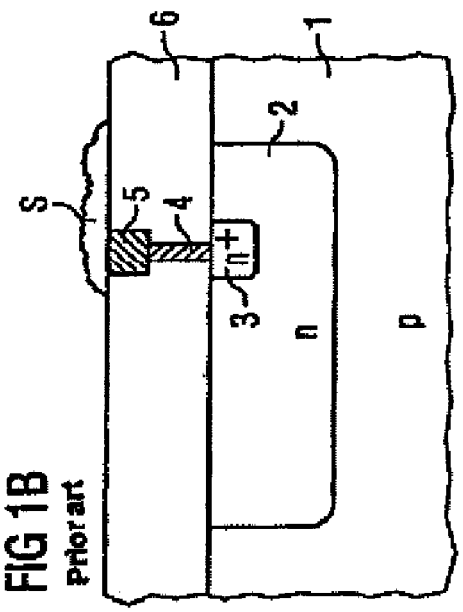

In order to avoid this above-described phenomenon of dendrite formation and/or accumulation of grinding residues S as shown in FIG. 1B, the semiconductor circuit arrangement in accordance with the first exemplary embodiment now has a (highly doped) discharge doping region 7 of the second conduction type n, which is formed at least in the first doping region 1 and in the second doping region 2 and is electrically conductive, with the result that the charge carriers formed during a planarization step can be dissipated from the second doping region 2 into the semiconductor substrate and/or first doping region 1.

More accurately, the discharge doping region 7 is formed directly at the surface of the semiconductor substrate 1, spaced apart from the connection doping region 3, in a junction region between the first and second doping regions 1 and 2. This results in a particularly simple way in a diode or a p-n junction with a reduced breakdown voltage, which is electrically connected to the second doping region 2. Both its formation and its alignment are in this case very simple to realize if the discharge doping region forms, for example, a diffusion strip which overlaps the n-well or the second doping region 2. Accordingly, within the second doping region 2, this discharge doping region 7 acts as an ohmic contact, whereas outside the second doping region or in the first doping region 1 of the semiconductor substrate it acts as a very effective discharge diode.

The charging which occurs during a planarization step and in particular during a chemical mechanical polishing operation can thereby be reliably prevented, with the result that the occurrence of dendrite formation and/or the accumulation of grinding residues, with associated short circuits, is suppressed. In this way, the layout guidelines originating from previous integration densities, in particular for, for example, mask sets of interconnect and metallization planes, can be transferred without alteration, which leads to a considerable reduction in costs for future integration densities.

In accordance with FIG. 3A, the second doping region 2 has, for example, a width $B_W$ and a length $L_W$, resulting in a surface area $F_W=B_W \times L_W$ for the second doping region 2. In the same way, the planarized surface of the electrically conductive structure and/or of the interconnect layer 5 has a width $B_M$ and a length $L_M$, which in turn results in an associated surface area $F_M = B_M \times L_M$ for the surface of the electrically conductive structure which is to be planarized.

Since the above-described formation of dendrites is dependent in particular also on a surface area ratio V of a surface area $F_W$ of the second doping region 2 to a surface area $F_M$ of the electrically conductive structure, it can be noted in particular that for the first time it is possible to deal with even surface area ratios $V = F_W/F_M$ of greater than 10 without the occurrence of dendrite formation when the discharge doping region 7 according to the invention is used.

Similarly, it has emerged that an absolute surface area of the planarized electrically conductive structure also has an influence on the above-described formation of dendrites. Accordingly, the uncovered or planarized surface area of the electrically conductive structure and/or of the interconnect layer 5 may now for the first time be smaller than 0.4 $\mu m^2$ without inducing the above-described accumulation of grinding residues and the risk of short circuits.

Figure 4:
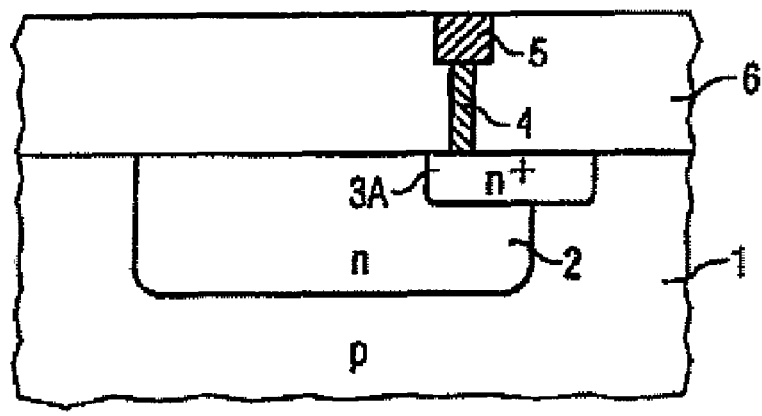
FIG. 4 shows a simplified sectional view through a semiconductor circuit arrangement in accordance with a second exemplary embodiment.

FIG. 4 shows a simplified sectional view through a semiconductor circuit arrangement in accordance with a second exemplary embodiment, identical reference symbols once again denoting identical or corresponding layers and elements to those shown in FIGS. 1A to 3B, which therefore will not be described again below.

Unlike in the exemplary embodiment shown in FIGS. 3A and 3B, in the present second exemplary embodiment the discharge doping region may also be formed as part of the connection doping region, resulting in a connection/discharge doping region 3A which extends into the first doping region.

Once again, the discharge doping region has a highly doped region of the second conduction type n, with an ohmic contact to the electrically conductive structure 4 and 5 and/or to the n-well 2 being formed in the second doping region 2 and an optimized discharge diode into the first doping region being formed in the semiconductor substrate 1.

Since, furthermore, only a single doping region is used and the desired discharge doping region can be realized simply by changing a size and/or position of this connection/discharge doping region 3A, a semiconductor circuit arrangement with reduced formation of dendrites is realized in a particularly simple and inexpensive way.

Figure 5:
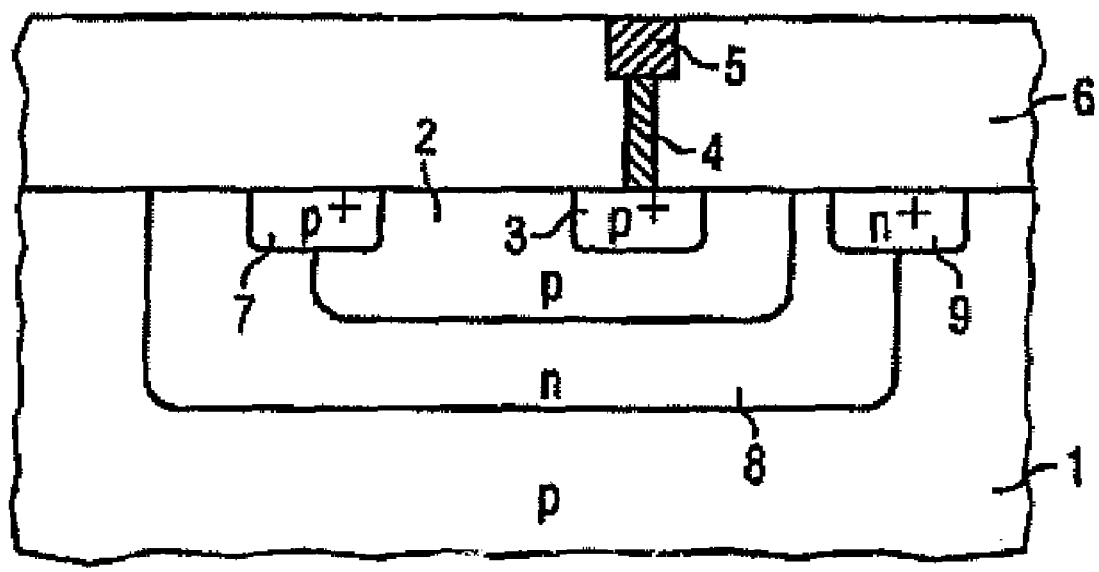
FIG. 5 shows a simplified sectional view through a semiconductor circuit arrangement in accordance with a third exemplary embodiment.

FIG. 5 shows a simplified sectional view through a semiconductor circuit arrangement in accordance with a third exemplary embodiment, wherein once again identical reference symbols denote identical or corresponding elements and layers to those shown in FIGS. 1 to 4, which will not be described again in the text which follows.

In accordance with FIG. 5, the present invention can also be applied to what is known as a multiple-well structure; in the present case, by way of example, a triple-well structure is shown.

Accordingly, in accordance with FIG. 5 a semiconductor substrate 1 having a first doping p includes an additional well or an additional doping region 8 with an opposite doping n, in which, finally, there is in turn a third well 2 having a connection doping region 3 which is connected to the electrically conductive structure 4 and 5 embedded in the insulation layer 6.

Once again, a discharge doping region 7 can be provided to prevent a charging effect from the third well 2 to the second well 8; an additional discharge doping region 9 is formed in the junction region of the respective p-n junctions in order to avoid undesirable charging between the semiconductor substrate and the second well 8.

Although the discharge doping region 7 is spaced apart from the connection doping region, it could also be realized as part of this connection doping region, as in the second exemplary embodiment. The mode of action of the corresponding discharge doping regions is in this case analogous to the first and second exemplary embodiments, and consequently there is no need for a detailed description below. Therefore, it is fundamentally also possible to reliably prevent the formation of dendrites in a multiple-well structure of this type.

Figure 6:
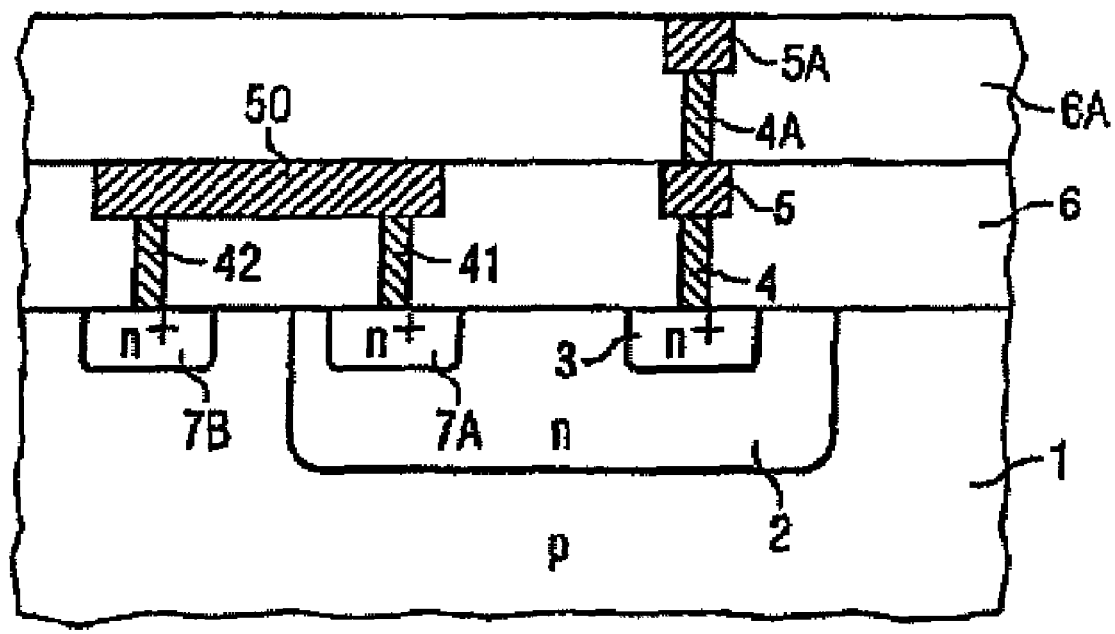
FIG. 6 shows a simplified sectional view through a semiconductor circuit arrangement in accordance with a fourth exemplary embodiment.

FIG. 6 shows a simplified sectional view in accordance with a fourth exemplary embodiment, with identical reference symbols once again denoting identical or corresponding layers and elements, which are not described again in the text which follows.

In accordance with FIG. 6, a significant difference with respect to the first exemplary embodiment shown in FIG. 3B is that the discharge doping region now has a first discharge doping subregion 7B, which is formed in the first doping region 1 of the semiconductor substrate, while a second discharge doping subregion 7A is formed in the second doping region 2. The discharge doping subregions 7A and 7B in turn comprise highly doped regions of the second conduction type n, these subregions being connected to one another, for example by means of an electrically conductive structure which is present in the insulation layer 7 and comprises an additional interconnect layer 50 and two additional contact holes 41 and 42 filled with electrically conductive material.

The first discharge doping subregion 7B in turn represents a special discharge diode in the first doping region, and the second discharge doping subregion 7A represents an ohmic connection contact in the second doping region, with the result that the charge carriers which occur during a planarization step can be reliably dissipated into the semiconductor substrate.

Furthermore, FIG. 6 shows a further interconnect or metallization plane, in which a further interconnect layer 5A and a further contact hole or via 4A filled with electrically conductive material are formed. Accordingly, a corresponding accumulation of grinding residues and/or the abovementioned formation of dendrites can be reliably prevented not only in an electrically conductive structure, which is connected directly to a well or a second doping region 2, in an (e.g. first) interconnect plane, but also in electrically conductive structures belonging to interconnect planes and/or metallization layers above. In particular, in this case too the above-described surface area ratios V between the surface area of the second doping region and planarized surface and the absolute surface area values for the planarized surface continue to apply.

By way of example, monocrystalline silicon is used as semiconductor substrate 1 to realize an optimized semiconductor circuit arrangement, in which case the first doping region has a p-well with a dopant concentration of $1 \times 10^{17}$ to $1 \times 10^{18}$ $cm^{-3}$. It is preferable to use boron for this purpose. By way of example, a dopant concentration of $1 \times 10^{17}$ to $1 \times 10^{18}$ $cm^{-3}$ is established for the second doping region 2 or the n-well using phosphorus. To realize the $n^+$-discharge doping region or the connection doping region with its significantly higher dopant concentration compared to the first and/or second doping region, it is preferable to use a dopant concentration of $3 \times 10^{20}$ to $6 \times 10^{20}$ $cm^{-3}$, "active" arsenic preferably being used in this case. In this way, it is possible to realize discharge diodes with optimum discharge properties for avoidance of the above-described formation of dendrites.

In the case of the abovementioned multiple-well structures, it is also possible for the $p^+$-discharge doping regions to have a dopant concentration of $1 \times 10^{20}$ to $3 \times 10^{20}$ $cm^{-3}$, with "active" boron preferably once again being used in this case.

The invention has been described above on the basis of silicon semiconductor material with associated dopant concentrations. However, it is not restricted to this particular embodiment and also encompasses, in the same way, alternative semiconductor materials with corresponding dopant concentrations to form desired discharge doping regions.

It is therefore intended that the foregoing detailed description be regarded as illustrative rather than limiting, and that it be understood that it is the following claims, including all equivalents, that are intended to define the spirit and scope of this invention.

The invention claimed is:

1. A method for preventing the formation of dentrites, the method comprising:
    providing a semiconductor substrate comprising a first doping region of a first conduction type;
    forming a second doping region in the semiconductor substrate, the second doping region comprising a second conduction type that is opposite to the first conduction type;
    forming a highly doped connection in at least part of the second doping region, the highly doped connection region comprising the second conduction type;
    forming a highly doped discharge region in at least the first and second doping regions, the highly doped discharge region comprising the second conduction type;
    forming an insulation layer over a surface of the first doping region, the second doping region, the highly doped connection region, and the highly doped discharge region;
    forming an electrically conductive structure that extends through the insulation layer and is electrically connected to the highly doped connection region, wherein a surface area of the electrically conductive structure is less than 0.4 $\mu m^2$; and
    planarizing the insulation layer after forming the electrically conductive structure, wherein during the planarization charge carriers dissipate from the second doping region into at least one of the semiconductor substrate and the first doping region, preventing the formation of dentrites.

2. The method of claim 1, wherein forming the highly doped discharge region comprises:
    forming a diffusion strip in a junction between the first and second doping region.

3. The method of claim 1, wherein a ratio of a surface area of the second doping region to a surface area of the electrically conductive structure is greater than 10.

4. The method of claim 1, wherein forming the electrically conduction structure comprises:
    forming an electrically conductive structure comprising at least one Cu interconnect layer using a Damascene process.

5. The method of claim 1, wherein forming the highly doped discharge region comprises:
    forming the highly doped discharge region at a surface of the semiconductor substrate.

6. The method of claim 1, wherein the insulation layer is additionally formed over the highly doped discharge region.

7. A method for preventing the formation of dentrites, the method comprising:
    planarizing a semiconductor comprising:
        a first doping region comprising a first conduction type;
        a second doping region comprising a second conduction type formed at least in part in the first doping region, the second conduction type being opposite to the first conduction type;
        a highly doped connection region comprising the second conduction type, the highly doped connection region formed at least in part in the second doping region;
        an insulation layer formed over a surface of the first doping region, second doping region, and highly doped connection region;
        an electrically conductive structure, extending through the insulation layer and electrically connected to the highly doped connection region, wherein a surface area of the electrically conductive structure is less than 0.4 $\mu m^2$; and
        a highly doped discharge region comprising the second conduction type, the highly doped discharge region formed in at least the first and second doping regions;
    wherein during the planarization of the semiconductor, charge carriers dissipate from the second doping region into at least one of the semiconductor substrate and the first doping region.

8. The method of claim 7, wherein the highly doped discharge region of the planarized semiconductor is a diffusion strip formed in a junction between the first and second doping regions.

9. The method of claim 7, wherein a ratio of the surface area of the second doping region of the planarized semiconductor to the surface area of the electrically conductive structure of the planarized semiconductor is greater than 10.

10. The method of claim 7, wherein the electrically conductive structure of the planarized semiconductor comprises at least one Cu interconnect layer produced using a Damascene process.

11. The method of claim 7, wherein the highly doped discharge region is formed at a surface of the semiconductor substrate.

* * * * *

UNITED STATES PATENT AND TRADEMARK OFFICE
CERTIFICATE OF CORRECTION

PATENT NO. : 7,655,563 B2 Page 1 of 1
APPLICATION NO. : 11/963373
DATED : February 2, 2010
INVENTOR(S) : Gabriela Brase et al.

It is certified that error appears in the above-identified patent and that said Letters Patent is hereby corrected as shown below:

On the Title Page

In the left column insert a new item as follows.

Item (30) -- Foreign Application Priority Data

November 27, 2003    (PCT)   PCT/DE03/03934
        December 10, 2002    (DE)    102 57 682.3 --.

In the left column insert a new item as follows.

Item (63) -- U.S. Application Priority Data

June 10, 2005   (US)   11/150,659 --.

Signed and Sealed this

Sixteenth Day of November, 2010

David J. Kappos
*Director of the United States Patent and Trademark Office*